United States Patent [19]

Sheets et al.

[11] Patent Number: 4,655,530

[45] Date of Patent: Apr. 7, 1987

[54] SNAP-IN MODULE FOR RECEIVER ASSEMBLY

[75] Inventors: Donald L. Sheets, Waynesboro; Sherwood A. Hoover, Lyndhurst; Ronnie D. Hunt, Waynesboro; Henri T. Burgers, Grottoes, all of Va.

[73] Assignee: Virginia Panel Corporation, Waynesboro, Va.

[21] Appl. No.: 819,367

[22] Filed: Jan. 16, 1986

[51] Int. Cl.[4] .............................................. H02B 1/04
[52] U.S. Cl. .................................. 339/126 R; 339/128
[58] Field of Search .............. 361/386, 388, 426, 429; 339/75 M, 75 MP, 126 R, 12 B, 92 M

[56] References Cited

U.S. PATENT DOCUMENTS 3,040,289  6/1962  Wicks ............................. 339/126 R Primary Examiner—Eugene F. Desmond
Attorney, Agent, or Firm—B. P. Fishburne, Jr.

[57] ABSTRACT

To eliminate the excessive time and labor involved in the installation and removal of multi-contact module bars of receiver frames and/or individual test adapter frames, a self-contained module bar is equipped at opposite ends with beveled spring-urged plungers which can snap into receptor recesses provided in a receiver inner frame or in a test adapter frame. The plungers are retracted by use of a simple tool to allow quick removal of the module bar. A spring clip on each end of the module bar assures firm contact of the module bar with datum surfaces of the receiver frame or individual test adapter frame.

10 Claims, 7 Drawing Figures

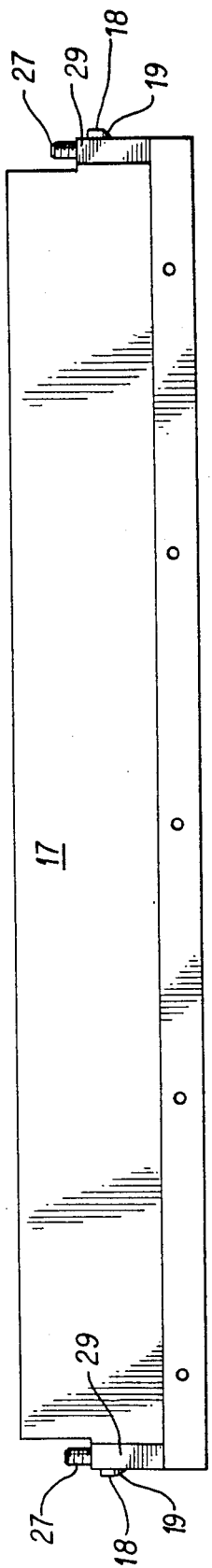
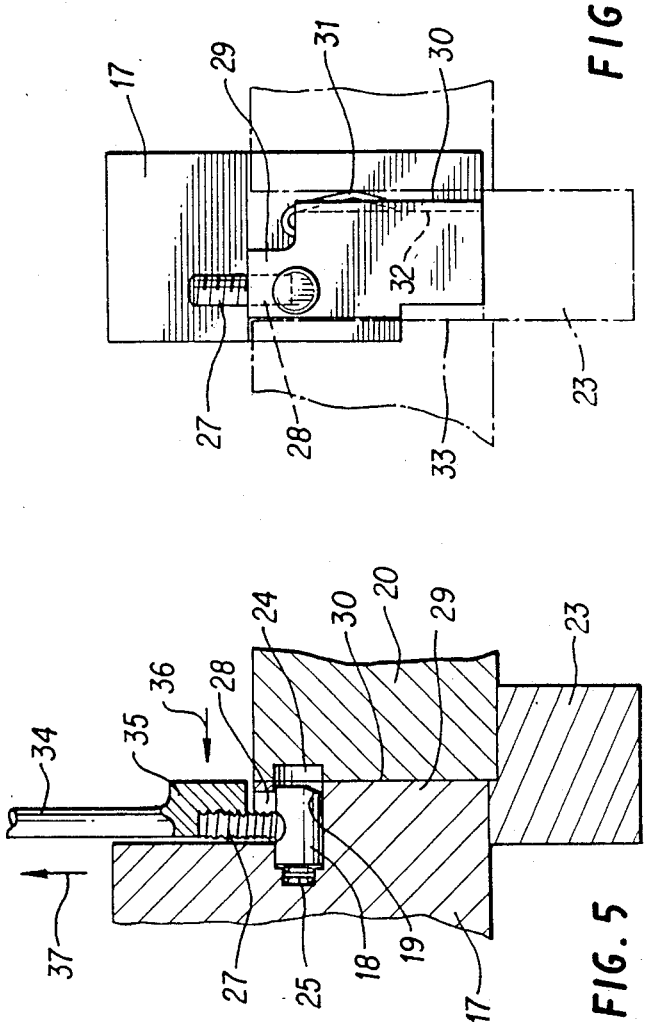

SNAP-IN MODULE FOR RECEIVER ASSEMBLY

BACKGROUND OF THE INVENTION

The present invention relates to a quickly insertable and removable multi-contact module for receiver frames and/or individual test adapter frames of the class shown in U.S. Pat. No. 4,329,005 and other prior art patents. In the prior art, when the necessity for removing or replacing a multi-contact module bar arose, it became necessary to remove front retainer strips on the receiver frame which were used to hold module bars in contact with a rear retainer surface while the ends of the module bar were located in notches provided in the frame members of the receiver. The removal and reinstallation of the front retainer strips involved the manipulation of up to twelve or sixteen screws per retainer strip. This tedious operation proved to be time-consuming and costly to users of the equipment.

Accordingly, the principal object of the present invention is to provide an improved module bar for receiver frames and the like whose use completely eliminates the aforementioned front retainer strips and the multitude of screws required to attach the strips to a receiver frame for retaining the prior art module bars in place in the frame.

More particularly, it is the objective of the present invention to provide a quick installable and removable module bar which can literally be snapped into place with precision on a receiver frame or the like without the use of any tools or the use of any separate retainer means. Moreover, the snap-in module bar can be quickly removed from its installed position by using a very simple and highly convenient tool which causes the retraction of spring-loaded locking plungers on the ends of the module bar from receptor recesses of the receiver or test adapter frame. The arrangement is secure and reliable in terms of properly positioning module bars in a receiver frame or the like and eliminates the tedium previously involved in the installation and removal of module bars from their support frames.

Still another feature and object of the invention is to provide yielding means on each end of the snap-in module bar according to the present invention to maintain the bar properly seated against datum surfaces of the receiver frame or test adapter frame.

Other features and advantages of the invention will become readily apparent to those skilled in the art during the course of the following detailed description.

BRIEF DESCRIPTION OF THE DRAWINGS

FIG. 4 is a side elevation of a module bar according to the present invention.

FIG. 5 is a view similar to FIG. 3 depicting the use of the tool for releasing the snap-in module bar from its frame.

FIG. 6 is an end elevation of the snap-in module bar with associated frame elements shown in phantom lines.

DETAILED DESCRIPTION

Figure 1:
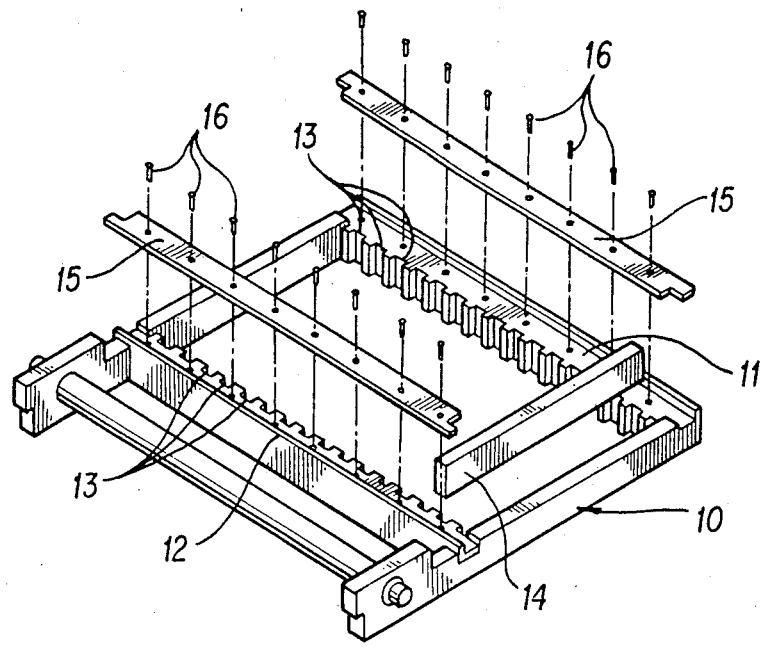
FIG. 1 is an exploded perspective view of a receiver frame with retainer strips and multiple attaching screws for multi-contact modules according to the prior art.
Figure 7:
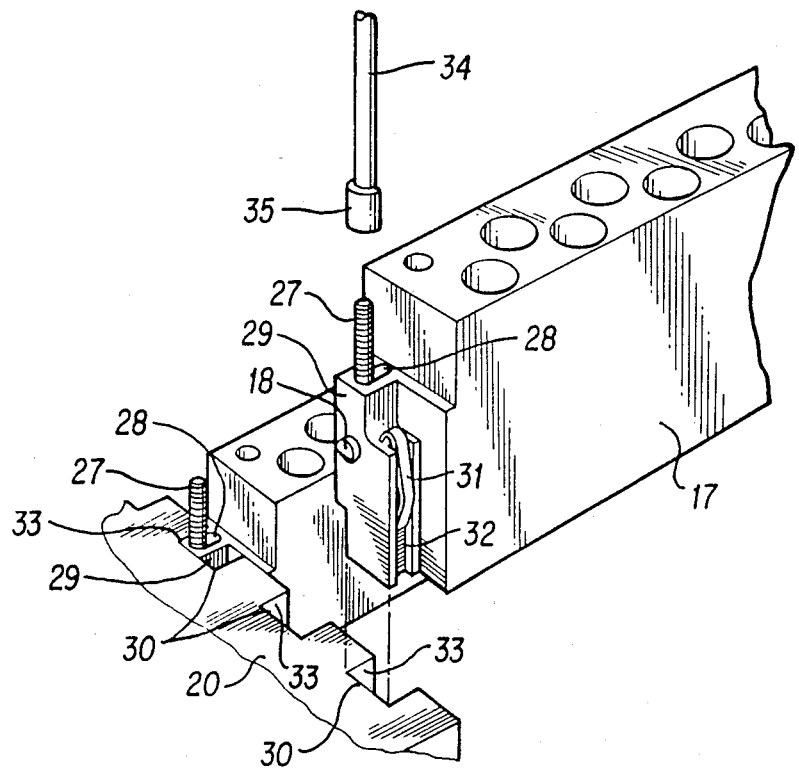
FIG. 7 is a fragmentary exploded perspective view of snap-in module bars and associated elements.
Figure 3:
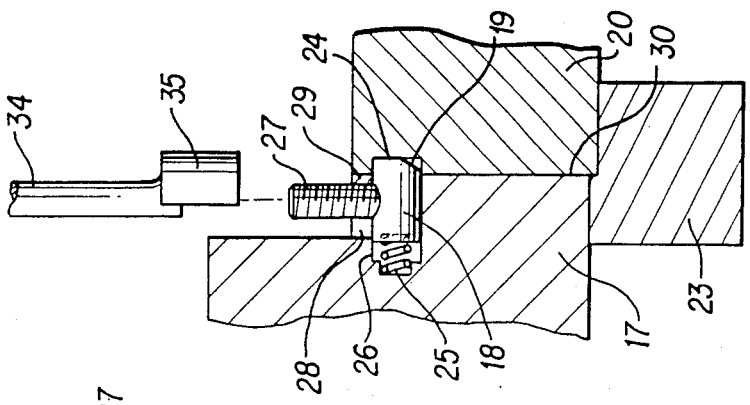
FIG. 3 is an enlarged fragmentary vertical section taken on line 3—3 of FIG. 2 and showing a tool used in the removal of module bars from their frame, the tool being absent in FIG. 2.

Referring to the drawings in detail wherein like numerals designate like parts, and referring first to FIG. 1, a prior art receiver frame 10 of the type shown in U.S. Pat. No. 4,329,005 is illustrated. The receiver frame 10 includes spaced opposing parallel side members 11 and 12 having aligned notches 13 formed therein to receive multi-contact module bars 14. These prior art module bars have their opposite end portions engaged in the notches 13 and are retained in the frame 10 by front retainer strips 15 which extend entirely along the side members 11 and are attached thereto by screws 16 which can number as many as twelve or sixteen per retainer strip 15. The retainer strips 15 overlap the ends of the module bars 14 and hold them securely in place in the receiver frame 10. The sides of the module bars 14 away from the strips 15 rest solidly on rear fixed retainer elements which are not removable.

As stated previously, the main feature of the present invention is the elimination of the front retainer strips 15 and the large number of screws 16 securing the strips to a receiver frame or the like.

Figure 2:
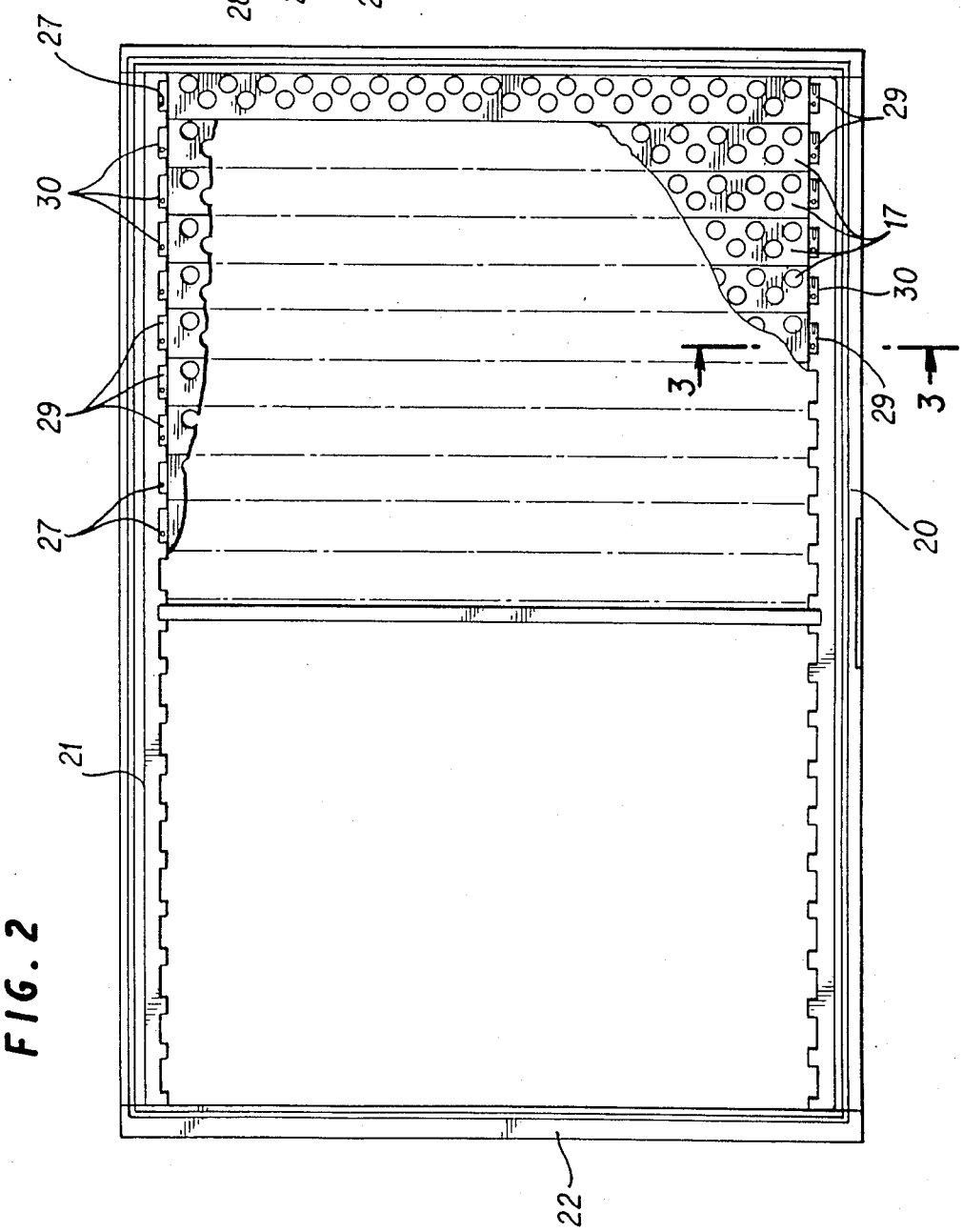
FIG. 2 is a plan view of quickly installable and removable snap-in module bars and a receiver frame for the same in accordance with the present invention.

In accordance with the invention, multi-contact module bars 17 are equipped at their opposite ends with longitudinal axis cylindrical snap-locking plungers 18 having narrow beveled faces 19 adjacent to their rear sides with relation to the adjacent receiver frame member 20. This frame member 20, FIG. 2, forms part of a rectangular receiver frame, or in some cases an individual test adapter frame having an opposite side member 21 and a pair of end frame members 22. As shown in FIG. 2, the frame for the module bars 17 according to the invention can accept one group of module bars 17 or two groups. In some cases, the frame can be constructed to receive a greater or lesser number of the module bars. A receiver frame in accordance with the invention can be constructed to receive one or more individual test adapter frames. In all cases, the convenient snap-in and easily extractable module bar 17 operates in the manner being described herein.

The rear face of each module bar 17 rests solidly against a rear retainer 23 when the module bar is snapped into its use position in the surrounding frame. The frame members 20 and 21 adjacent to the ends of each module bar 17 have receptor or locking recesses 24 into which the plungers 18 are snapped. Each plunger 18 is biased outwardly by a compression spring 25 contained in the rear of a bore 26 formed in each end of the module bar 17 to receive the locking plunger 18 movably. When the two ends of each module bar 17 are snapped into place between the frame sides 20 and 21, the beveled faces 19 of the plungers ride easily over the edges of the frame sides 20 and 21 and cause the plungers 18 to retract automatically in the bores 26 so that their outer ends are flush with the end faces of the module bar 17 as shown in FIG. 5.

Each plunger carries a radial screw-threaded pin or stud 27 anchored thereto and projecting from the side of the plunger remote from the beveled face 19. The threaded stud 27 extends through a longitudinally elongated slot 28 provided in a projecting end portion 29 of the module bar 17 at each end thereof.

The projecting end portion 29 at each end of each module bar 17 engages within precision notches 30 formed in the interior faces of frame members 20 and 21. The elongated slots 28 prevent rotation of the plungers 18 on their longitudinal axes, thereby maintaining the beveled faces 19 properly oriented. The slots 28 allow movement of the plungers 18 axially against the forces exerted by the springs 25.

Each projecting end portion 29 of each module bar 17 carries a spring clip element 31 held in a groove 32 formed in the portion 29. As shown in FIG. 6, each spring clip 31 has a bowed portion projecting somewhat outside of the groove 32 and bearing against the adjacent opposing surface of one of the notches 30. The purpose of this arrangement is to assure that each module bar 17, at its opposite ends, is urged solidly by the spring clips 31 against a datum surface 33 defined by the opposite side face of the notch 30.

From the foregoing description, it should be clear that each multi-contact module bar 17 can easily be snap-locked into position within a receiver frame or the like in side-by-side substantially abutting relationship with adjacent module bars. To do this, the two ends of the module bar are slipped into a pair of notches 30, one on each side of the frame, and the module bar is pushed inwardly or rearwardly until it bottoms on the fixed rear retainer elements 23. As this occurs, the two plungers 18 will snap automatically and lockingly into the recesses 24, as described above. The cumbersome front retainer strips 15 and their attaching screws 16 are entirely eliminated by the invention.

To release and extract each snap-in module bar 17 at required times, a simple manual tool is provided having a handle portion 34 and a half-circle internally threaded head 35. As best shown in FIG. 5, this tool is simply slipped into a provided space at each end of the module bar 17 above the projecting portion 29 and the internal threads of the tool head 35 are engaged with the threads of the stud 27. Sufficient lateral pressure indicated by the arrow 36 in FIG. 5 is exerted on each stud 27 to retract the adjacent plunger 19 flush with the end face of the module bar. Following this, sufficient longitudinal pulling pressure indicated by the arrow 37 is exerted on the tool 34 to extract the module bar 17 bodily from the receiver frame or the like with which it has been engaged. A pair of the simple hand tools, one for each end of the module bar 17 being extracted from the frame, can conveniently be utilized.

Upon separation of the tool from each stud 27 and the release of lateral pressure thereon, the plunger 18 returns automatically under the influence of the spring 25 to its normal extended position, whereby the module bar is ready to be snapped into place on the same frame or another frame.

It is to be understood that the form of the invention herewith shown and described is to be taken as a preferred example of the same, and that various changes in the shape, size and arrangement of parts may be resorted to, without departing from the spirit of the invention or scope of the subjoined claims.

We claim:

1. A snap-in readily removable module for a receiver assembly or the like comprising a bar-like body adapted to carry a multiplicity of electrical contact elements and including end portions adapted to enter locator notches in a module supporting frame, a spring-urged plunger on each end of the bar-like body having an axis extending longitudinally of the body and normally projecting somewhat beyond an adjacent end face of the body and having a beveled surface, a threaded stud fixed on each plunger and extending radially thereof across the longitudinal axis of the bar-like body, each end portion of the bar-like body having a slot receiving said stud and allowing the stud to move with said plunger longitudinally of the bar-like member and also preventing rotation of the stud on its longitudinal axis thereby maintaining a proper orientation of said beveled surface of the plunger, and a spring element on one side of each end portion and exerting a yielding force in one direction laterally of the bar-like body substantially perpendicular to the axis of said plunger and serving to push one side face of said end portion into engagement with a datum surface formed by one side face of each notch in a module supporting frame.

2. A snap-in readily removable module for a receiver assembly or the like as defined in claim 1, and a threaded tool separate from the module engageable with each threaded stud and being operable in conjunction with the stud to retract each plunger to a position flush with an end face of the module and to then extract the module bodily from a frame by a force applied through the tool axially of each stud.

3. A snap-in readily removable module for a receiver assembly or the like as defined in claim 2, and said tool including an elongated rod-like handle portion and an approximately half-circle internally threaded head adapted to be engaged threadedly with one side of the stud.

4. A snap-in readily removable module for a receiver assembly or the like as defined in claim 1, and said spring-urged plunger comprising a cylindrical plunger element received in a bore formed in said end portion, and a compression spring contained in said bore behind the plunger and constantly urging the plunger outwardly so that it normally projects beyond one end face of the module, and said slot having one end limiting the outward movement of the plunger through engagement with said stud.

5. A snap-in module for a receiver assembly or the like comprising a rectangular frame having opposite side locator notches and a rear retainer surface, said notches having locking recesses formed therein, and an easily insertable and removable multi-contact module bar for each opposing pair of notches in said frame, a spring-urged releasable locking plunger on each end of the module bar normally projecting somewhat beyond the adjacent end face of the module bar and being retractable to a position flush with the adjacent end face of the module bar to enable removal of the module bar from said frame, and spring means on one side of the module bar near its ends acting across the axes of said plungers and engaging side faces of the notches to urge the module bar into engagement with datum surfaces on said frame.

6. A snap-in module for a receiver assembly or the like as defined in claim 5, and a threaded stud secured to each plunger and extending radially thereof and substantially perpendicular to the longitudinal axis of the module bar, whereby the studs can be engaged by a threaded implement to first retract the plungers flush with the end faces of the module bar and then pull the module bar from said notches and frame.

7. A snap-in module for a receiver assembly or the like as defined in claim 6, and said plungers having beveled faces which render the plungers automatically retractable in response to contact with edges of said frame when the module bar is being inserted in the frame.

8. A snap-in module for a receiver assembly or the like as defined in claim 7, and the module bar having slots near its opposite ends receiving said studs and preventing rotation of said plungers while allowing them to move inwardly and outwardly axially and also limiting movement of said studs outwardly with said plungers.

9. A snap-in module for a receiver assembly or the like as defined in claim 5, and the module bar having reduced width end extensions which fit into said notches and which carry said plungers and said spring means.

10. A snap-in module for a receiver assembly or the like as defined in claim 9, and said spring means comprising spring clips held in grooves of the reduced width end extensions and including bowed portions projecting somewhat outside of said grooves.

* * * * *